United States Patent [19]
Ross

[11] 3,904,949
[45] Sept. 9, 1975

[54] APPARATUS AND METHOD FOR INCREASING THE SINUSOIDAL LINE-TO-LINE OUTPUT VOLTAGE LEVEL OF ANY MULTI-PHASE POWER AMPLIFIER OPERATING AT A MAXIMUM LINE-TO-GROUND OUTPUT VOLTAGE LEVEL

[75] Inventor: James A. Ross, La Jolla, Calif.

[73] Assignee: Rohr Industries, Inc., Chula Vista, Calif.

[22] Filed: Jan. 31, 1974

[21] Appl. No.: 438,228

[52] U.S. Cl. .......... 321/9 R; 307/3; 328/14; 340/347 DA
[51] Int. Cl.² .......... H02M 1/12
[58] Field of Search .......... 321/5, 9 R; 328/14, 23; 307/3; 340/347 DA

[56] References Cited

UNITED STATES PATENTS

| | | | |
|---|---|---|---|
| 3,641,442 | 2/1972 | Boucher | 328/14 |
| 3,641,566 | 2/1972 | Konrad et al. | 328/14 |
| 3,657,657 | 4/1972 | Jefferson | 328/14 |
| 3,732,507 | 5/1973 | Christiansen et al. | 340/347 DA |
| 3,772,681 | 11/1973 | Skingle | 340/347 DA |
| 3,824,442 | 7/1974 | King | 321/5 |
| 3,839,667 | 10/1974 | King | 321/9 R |

*Primary Examiner*—William H. Beha, Jr.
*Attorney, Agent, or Firm*—Patrick J. Schlesinger; Frank D. Gilliam

[57] ABSTRACT

Apparatus and method for increasing the sinusoidal line-to-line output voltage level of any multi-phase power amplifier operating at a maximum line-to-ground output voltage level. The amplifier has input voltage signals distorted from a pure sinusoidal waveform to a signal having the waveform of $2\sqrt{3}$ sine $\phi$ + 1/6 (sine $3\phi$). The distorted waveform may be derived by combining with the sinusoidal input frequency $\phi$ at an amplitude of sine $\phi$ an in-phase sinusoidal signal of frequency $3\phi$ with an amplitude of $\sqrt{3/12}$ (sine $3\phi$), or synthetically by known electronic means comprising a binary counter, a programmed read only memory, an exclusive OR gate and a digital to analog converter.

5 Claims, 6 Drawing Figures

APPARATUS AND METHOD FOR INCREASING THE SINUSOIDAL LINE-TO-LINE OUTPUT VOLTAGE LEVEL OF ANY MULTI-PHASE POWER AMPLIFIER OPERATING AT A MAXIMUM LINE-TO-GROUND OUTPUT VOLTAGE LEVEL

BACKGROUND OF THE INVENTION

The present invention relates to power amplifiers operable through a wide range of input frequencies and more particularly to increasing the line-to-line output voltage level of conventional three phase power amplifiers and the like having line-to-line connected outputs operating at their maximum line-to-ground voltage level.

It would be very advantageous to be able to increase the maximum rated line-to-line output voltage level capabilities of a given conventional three phase power amplifier operating at maximum line-to ground voltage levels over a range of frequencies without changing its physical characteristics or to be able to reduce the physical size and the voltage insulation requirements of a given three phase power amplifier when its maximum line-to-line requirements are established. U.S. Pat. No. 3,211,914 by J. G. Anderson, teaches that increasing the line-to-line voltage of a three phase power transmission is possible by placing a power supply having a frequency three times that of the transmission frequency between ground and system neutral. The patent does not teach the possibility of applying this concept of three phase power amplifiers. The teachings of this patent have several obvious drawbacks. First, a high power triple frequency power supply is required to supply a portion of the final load power. The use of triple frequency voltage giving an amplitude equal to one quarter of the line frequency voltage is taught. The third harmonic voltage at this amplitude will not provide the maximum line-to-line voltage capabilities of the system because when the two signals are combined, the maximum voltage levels of the two frequencies will not coincide with respect to time, therefore, their summation is equal to less than an absolute maximum possible. Phase shifting between the two frequencies is found to exist especially when various changing power loads are applied or when long transmission lines are required. This phase shifting problem requires an additional phase shifter or triple frequency power unit at the remote end of the system to maintain the required relationship between the phases. The system is capable of operation only at a single predesigned frequency and not for a wide range of frequencies. Neither the application of a triple frequency to a three phase power amplifier nor the solutions to the various problems have been satisfactorily resolved until the emergence of the instant invention.

SUMMARY OF THE INVENTION

The instant invention maximizes the sinusoidal line-to-line output voltage of any given three phase power amplifier operating at maximum line-to-ground voltage line with the three outputs connected in a line-to-line configuration. The line voltage output is maximized by distorting its three phase related input signals in a prescribed manner. Each input signal comprises a sinusoidal signal of the desired ultimate output frequency mixed with its own third harmonic having an in phase relationship, the resulting summed signals have a waveform having a shape represented by the mathematical formula $2/\sqrt{3}$ sine of the ultimate output frequency plus 1/6 of the third harmonic of the ultimate frequency. The system is operative over a range of selected frequencies within the capabilities of the selected power amplifier without physical modifications thereto and is, therefore, not limited to merely a single predetermined input frequency. The output power requirements of the line-to-line voltage is provided by a single three phase power amplifier. Phase shifting is substantially non-existent because the phase relationship between the three outputs are maintained within the single power amplifier and any phase shifting will shift all outputs equally. Any conventional off-the-self three phase power amplifier may be used to practice the invention.

The invention both as to its organization and method of operation, as well as additional advantages thereof, will become more readily apparent from the reading of the following description in connection with the accompanying drawings in which:

DESCRIPTION OF THE PREFERRED EMBODIMENT

Figure 1:
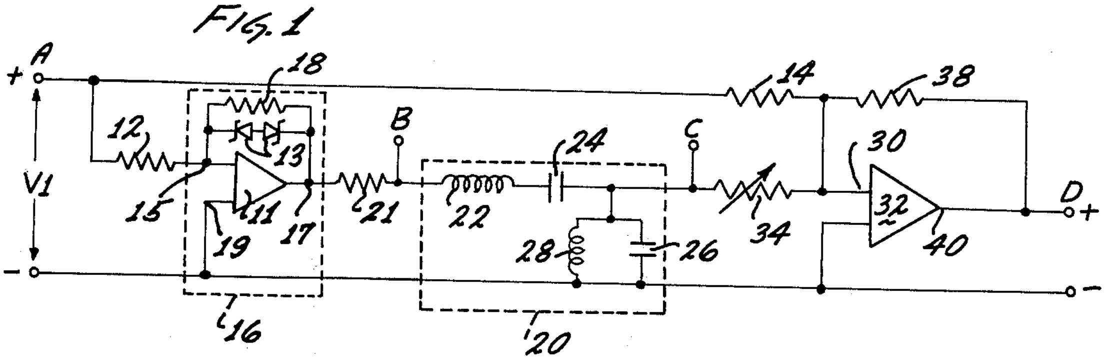
FIG. 1 is a schematic showing of a simplified wave distorting means.

FIG. 1 is a schematic showing of a single voltage phase of the instant invention. This figure will be described for the purpose of teaching the basic concepts of the invention. It should be kept in mind that for a three phase line-to-line (Y) connect output system two additional identical FIG. 1 circuits would be utilized. Only one FIG. 1 circuit is described herein for ease of explanation. The input signal waveform of two additional circuits (not shown) will be identical to the showings of FIG. 1 except each output voltage will be shifted in phase so as to provide a total of three 120° phase related output signal voltages.

The basic circuit comprises the electric components hereinafter described. The input signal $V_1$ shown in FIG. 2-A is applied between two fixed resistors 12 and 14 of approximately 10K ohms each that provide impedance matching between the input signal and the components of the circuit. The output from resistor 12 is connected to a clipper circuit 16. The clipper 16 comprises a type 741 or equivalent inverting amplifier 11 with two IN756 zener divider 13 connected in series back-to-back between the inverting input 15 and output 17 of amplifier 11 which is also the output of clipper 16. Resistor 18 determines the gain of the inverting amplifier 11 and has a value of approximately 10K ohms. The non-inverting input 19 of amplifier 11 is connected to negative or ground potential. A third harmonic filter 20 is connected to the output through resistor 21 that has its resistance value selected to match clipper 16 with the impedance of filter 20. The filter 20 comprises a series choke 22 and capacitor 24 and a tank circuit comprising a parallel capacitor 26 and choke 28 to ground. The values of these components are chosen as to be responsive to passing only the third harmonic of the input signal frequency. The output C of the tank circuit provides one input to terminal 30 of inverting and summing amplifier 32 through variable resistor 34 which is used for impedance matching and level setting. The inverting and summing amplifier 32 is a type 741 operational amplifier or equivalent. A second signal supplied through resistor 14 supplies a second input to terminal 30 of inverting and summing amplifier 32. The input from the harmonic filter 20 is adjusted to a level $\sqrt{3}/12$ the amplitude of the input waveform signal by adjustment of resistor 34. Feedback resistor 38 between the input terminal 30 and output terminal 40 determine the overall gain of the amplifier.

Figure 2:
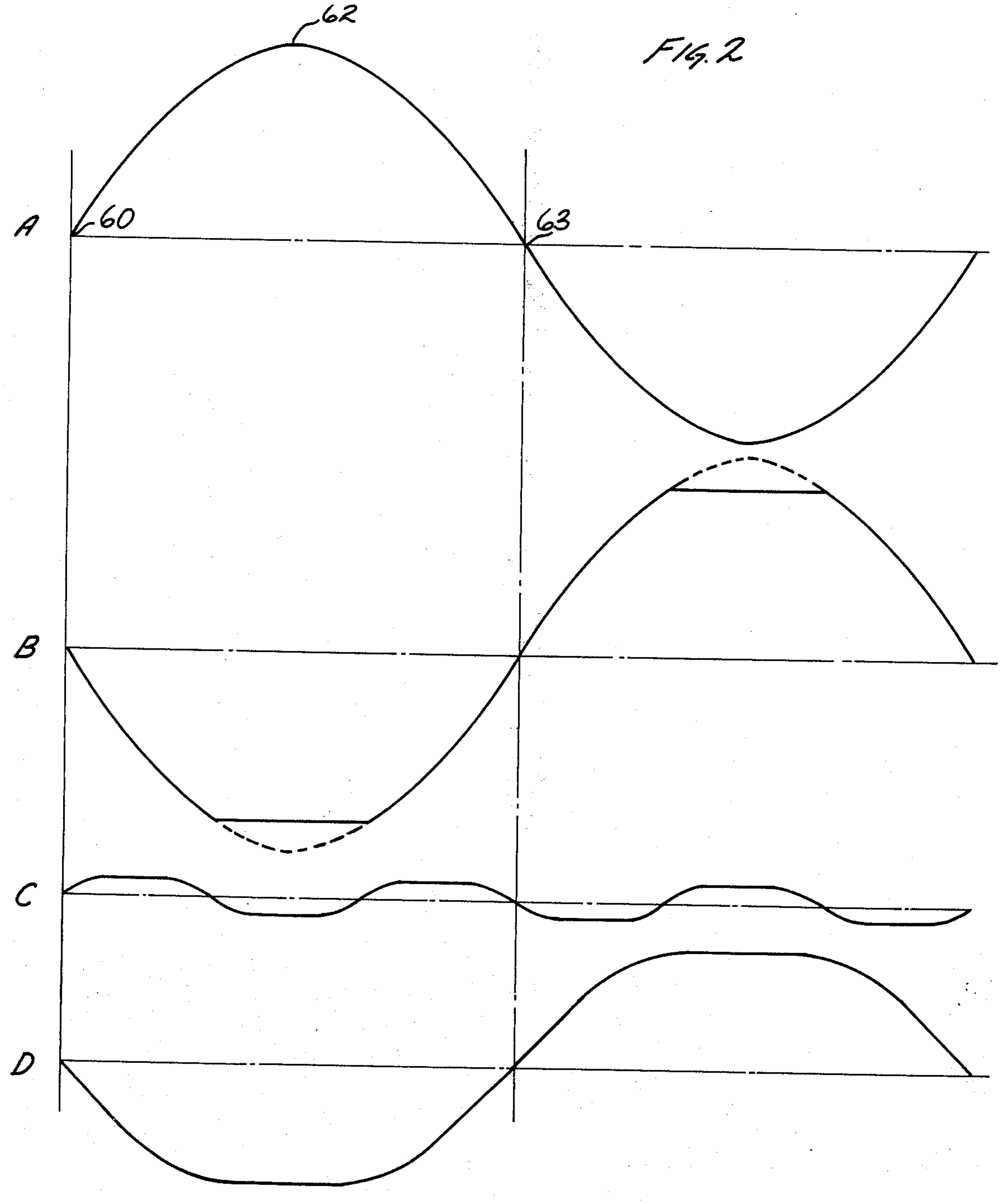
FIG. 2 shows waveforms taken at various signal flow points of the circuit of FIG. 1.
Figure 4:
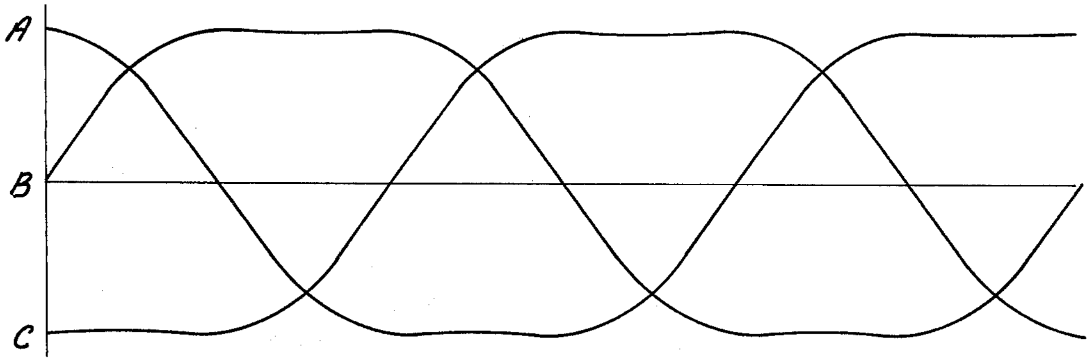
FIG. 4 is a phase related showing of the line-to-ground distorted waveform of a three phase related system.
Figure 5:
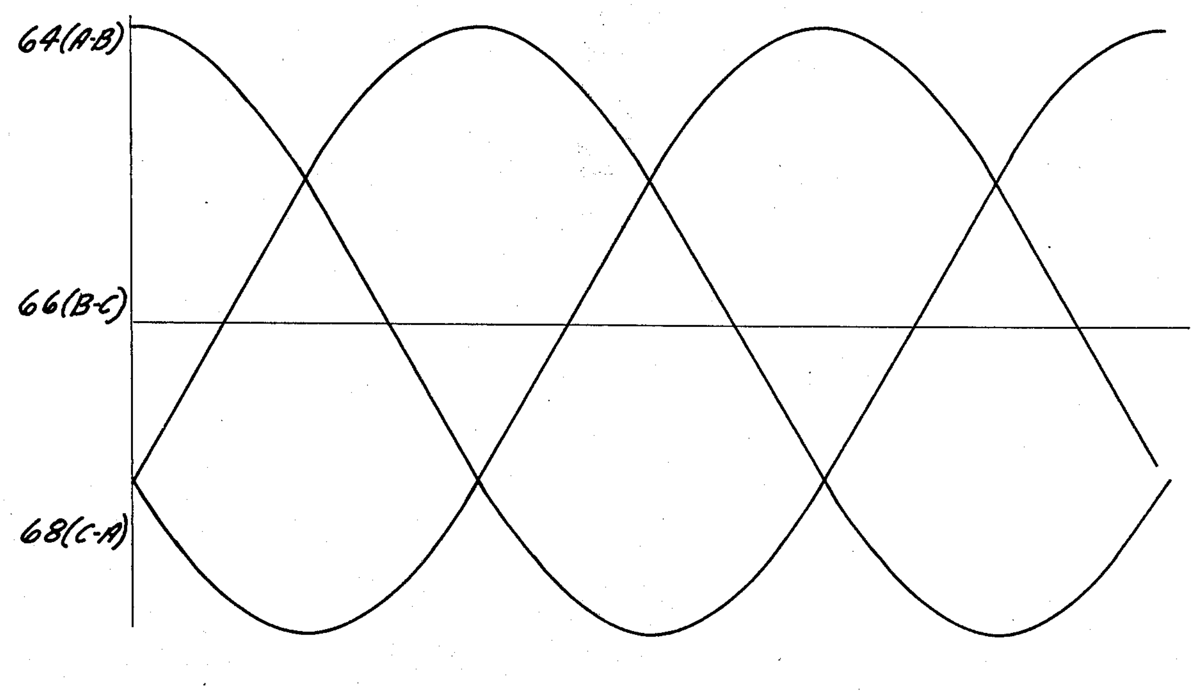
FIG. 5 shows the line-to-line summation of the distorted waveform of FIG. 4.

The circuit of FIG. 1 operates in the following manner. An AC signal from a conventional signal generator, not shown, provides the desired sinusoidal frequency $\phi$ at an amplitude shown by FIG. 2-A, is applied to $A_1$. One path for the input signal is through resistor 14 to the input terminal 30 of inverting and summing amplifier 32 wired in a conventional known manner with input tied directly to ground potential. This signal has substantially the same characteristics as the input signal A. Another signal path is through resistor 12 to the input of inverting clipper circuit 16 where a portion of the wave peaks are removed. This clipper signal, monitored at point B of the circuit, has a waveform as shown in FIG. 2-B. The clipper output supplies an input to the third harmonic filter 20. The output from the third harmonic filter 20 taken at point C of the circuit of FIG. 1 has the waveform of FIG. 2-C and has the mathematical equation $\sqrt{3}/12$ sine $3\phi$. The output of the third harmonic filter is also supplied to terminal 30 of inverting and summing amplifier 32 through level setting and impedance matching resistor 34. The two signals present at terminal 30 have the phase relationship shown by FIG. 2-A and 2-C. These two inputs are summed, amplified and inverted within the summing and inverting amplifier 32. The output D of the summing and inverting amplifier 32 with respect to ground potential has a distorted waveform as shown by FIG. 2-D having the equation $2/\sqrt{3}$ sine $\phi + 1/6$ (sine $3\phi$). As hereinbefore discussed, three of the circuits of FIG. 1 are required to practice the invention. Each of these circuits have identical waveforms as those shown by FIG. 2-A, -B, -C and -D taken at various points within the circuit but each have the required phase separation of 120 electrical degrees from each other such as that relationship well known in conventional three phase circuits. The configuration of the output voltage waveform taken at the output of each amplifier 56, 56', 56'' with respect to ground potential is shown by FIG. 4. The output voltage waveform taken between any pair of amplifier outputs is shown by FIG. 5. The FIG. 5 waveform is substantially a reproduction of the sinusoidal input waveform shown in FIG. 2-A with an increased amplitude and a shift in phase.

The effect of this invention is to enable an increase in the line-to-line output voltage of a given three phase amplifier beyond its maximum line-to-ground capabilities.

The circuit of FIG. 1 is presented with fixed value components merely to teach the concepts of the instant invention with a given input frequency various different input frequencies could be applied by changing the various component values of the third harmonic filter 20 either electronically or manually by known means.

Figure 3:
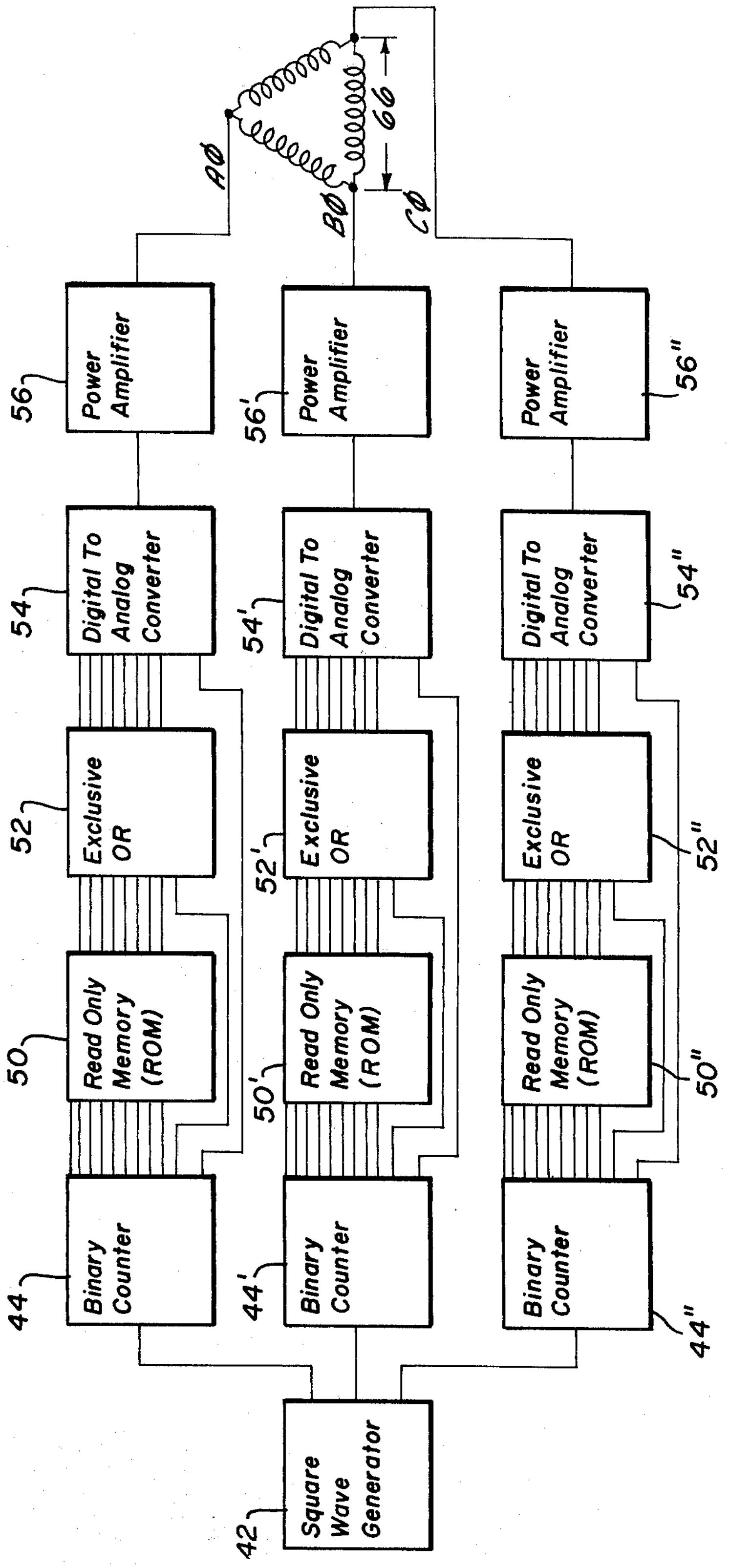
FIG. 3 is a block diagram of a second means for creating desired waveform distortion.

An additional embodiment of a three phase variable input frequency device is shown by FIG. 3. In this embodiment, the distorted waveform, $2/\sqrt{3}$ sine $\phi + 1/6$ (sine $3\phi$), is produced synthetically by electronic means.

Referring now to FIG. 3, this circuit comprises a square wave generator 42 that has three phase related outputs separated by 120° typical of three phase electrical circuitry. The output frequency of the generator 42 can be operator varied through a range of selected output frequencies. The specific frequency $\phi$ selected is determined by the required sine wave frequency of the output voltage.

Each output of the generator 42 supplies an input to counters 44, 44', 44''. The frequency output of each up/down counter 44, 44',44'' is equal to $\phi$ /2048.

The first nine output bits from each eleven bit binary counter 44, 44', 44'' are parallel fed into their respective Read Only Memory (ROM) 50, 50', 50''. Each ROM 50, 50', 50'' has eight parallel outputs. These outputs are parallel fed into the first inputs of their respective eight exclusive OR circuit (EX-OR) 52, 52', 52''. The second input to EX-OR 52, 52', 52'' is provided from the tenth bit of its respective binary counter 44, 44', 44''.

The eight parallel outputs from EX-OR 52, 52', 52'' are parallel fed into the signal input of their respective digital to analog converter (D/A) 54, 54', 54''. The sine bit input to their respective D/A 56, 56', 56'' is supplied from the eleventh bit of binary counters 44, 44', 44''.

The output signal from each D/A 54, 54', 54'', provides one input to a final power amplifier 56, 56', 56''.

The square wave generator 42 may be of any conventional type having the frequency range desired to practice the invention. The binary counters 44, 44', 44'' comprise three Motorola MC5493 integrated circuits or equivalent. The ROM is a Motorola MCM1140L device or equivalent that is pre-programmed in a known manner in the following truth table:

TABLE OF N, BINARY VALUES OF N AND FIRSTQUADRANT OF QUANTITY

510*(1/COS(PI/6)*SIN(N*PI/1024*N*PI)+1/6*SIN(3/1024*N*PI))

| N | INPUT BINARY N | OUTPUT BINARY QUANTITY |
|---|---|---|
| 511 | 111111111 | 11111011 |
| 510 | 111111110 | 11111011 |
| 509 | 111111101 | 11111011 |
| 508 | 111111100 | 11111011 |
| 507 | 111111011 | 11111011 |

TABLE OF N, BINARY VALUES OF N AND FIRSTQUADRANT OF QUANTITY—Continued

510*(1/COS(PI/6)*SIN(N*PI/1024*N*PI)+1/6*SIN(3/1024*N*PI))

| N | INPUT BINARY N | OUTPUT BINARY QUANTITY |
|---|---|---|
| 506 | 111111010 | 11111011 |
| 505 | 111111001 | 11111011 |
| 504 | 111111000 | 11111011 |
| 503 | 111110111 | 11111011 |
| 502 | 111110110 | 11111011 |
| 501 | 111110101 | 11111011 |
| 500 | 111110100 | 11111100 |
| 499 | 111110011 | 11111100 |
| 498 | 111110010 | 11111100 |
| 497 | 111110001 | 11111100 |
| 496 | 111110000 | 11111100 |
| 495 | 111101111 | 11111100 |
| 494 | 111101110 | 11111100 |
| 493 | 111101101 | 11111100 |
| 492 | 111101100 | 11111100 |
| 491 | 111101011 | 11111100 |
| 490 | 111101010 | 11111100 |
| 489 | 111101001 | 11111100 |
| 488 | 111101000 | 11111100 |
| 487 | 111100111 | 11111100 |
| 486 | 111100110 | 11111100 |
| 485 | 111100101 | 11111100 |
| 484 | 111100100 | 11111100 |
| 483 | 111100011 | 11111100 |
| 482 | 111100010 | 11111100 |
| 481 | 111100001 | 11111100 |
| 480 | 111100000 | 11111100 |
| 479 | 111011111 | 11111100 |
| 478 | 111011110 | 11111100 |
| 477 | 111011101 | 11111100 |
| 476 | 111011100 | 11111100 |
| 475 | 111011011 | 11111100 |
| 474 | 111011010 | 11111100 |
| 473 | 111011001 | 11111100 |
| 472 | 111011000 | 11111100 |
| 471 | 111010111 | 11111100 |
| 470 | 111010110 | 11111100 |
| 469 | 111010101 | 11111100 |
| 468 | 111010100 | 11111100 |
| 467 | 111010011 | 11111100 |
| 466 | 111010010 | 11111100 |
| 465 | 111010001 | 11111100 |
| 464 | 111010000 | 11111100 |
| 463 | 111001111 | 11111100 |
| 462 | 111001110 | 11111100 |
| 461 | 111001101 | 11111100 |
| 460 | 111001100 | 11111100 |
| 459 | 111001011 | 11111101 |
| 458 | 111001010 | 11111101 |
| 457 | 111001001 | 11111101 |
| 456 | 111001000 | 11111101 |
| 455 | 111000111 | 11111101 |
| 454 | 111000110 | 11111101 |
| 453 | 111000101 | 11111101 |
| 452 | 111000100 | 11111101 |
| 451 | 111000011 | 11111101 |
| 450 | 111000010 | 11111101 |
| 449 | 111000001 | 11111101 |
| 448 | 111000000 | 11111101 |
| 447 | 110111111 | 11111101 |
| 446 | 110111110 | 11111101 |
| 445 | 110111101 | 11111101 |
| 444 | 110111100 | 11111101 |
| 443 | 110111011 | 11111101 |
| 442 | 110111010 | 11111101 |
| 441 | 110111001 | 11111101 |
| 440 | 110111000 | 11111101 |
| 439 | 110110111 | 11111101 |

TABLE OF N, BINARY VALUES OF N AND FIRSTQUADRANT OF QUANTITY—Continued

510*(1/COS(PI/6)*SIN(N*PI/1024*N*PI)+1/6*SIN(3/1024*N*PI))

| N | INPUT BINARY N | OUTPUT BINARY QUANTITY |
|---|---|---|
| 438 | 110110110 | 11111101 |
| 437 | 110110101 | 11111101 |
| 436 | 110110100 | 11111101 |
| 435 | 110110011 | 11111110 |
| 434 | 110110010 | 11111110 |
| 433 | 110110001 | 11111110 |
| 432 | 110110000 | 11111110 |
| 431 | 110101111 | 11111110 |
| 430 | 110101110 | 11111110 |
| 429 | 110101101 | 11111110 |
| 428 | 110101100 | 11111110 |
| 427 | 110101011 | 11111110 |
| 426 | 110101010 | 11111110 |
| 425 | 110101001 | 11111110 |
| 424 | 110101000 | 11111110 |
| 423 | 110100111 | 11111110 |
| 422 | 110100110 | 11111110 |
| 421 | 110100101 | 11111110 |
| 420 | 110100100 | 11111110 |
| 419 | 110100011 | 11111110 |
| 418 | 110100010 | 11111110 |
| 417 | 110100001 | 11111110 |
| 416 | 110100000 | 11111110 |
| 415 | 110011111 | 11111110 |
| 414 | 110011110 | 11111110 |
| 413 | 110011101 | 11111110 |
| 412 | 110011100 | 11111110 |
| 411 | 110011011 | 11111111 |
| 410 | 110011010 | 11111111 |
| 409 | 110011001 | 11111111 |
| 408 | 110011000 | 11111111 |
| 407 | 110010111 | 11111111 |
| 406 | 110010110 | 11111111 |
| 405 | 110010101 | 11111111 |
| 404 | 110010100 | 11111111 |
| 403 | 110010011 | 11111111 |
| 402 | 110010010 | 11111111 |
| 401 | 110010001 | 11111111 |
| 400 | 110010000 | 11111111 |
| 399 | 110001111 | 11111111 |
| 398 | 110001110 | 11111111 |
| 397 | 110001101 | 11111111 |
| 396 | 110001100 | 11111111 |
| 395 | 110001011 | 11111111 |
| 394 | 110001010 | 11111111 |
| 393 | 110001001 | 11111111 |
| 392 | 110001000 | 11111111 |
| 391 | 110000111 | 11111111 |
| 390 | 110000110 | 11111111 |
| 389 | 110000101 | 11111111 |
| 388 | 110000100 | 11111111 |
| 387 | 110000011 | 11111111 |
| 386 | 110000010 | 11111111 |
| 385 | 110000001 | 11111111 |
| 384 | 110000000 | 11111111 |
| 383 | 101111111 | 11111111 |
| 382 | 101111110 | 11111111 |
| 381 | 101111101 | 11111111 |
| 380 | 101111100 | 11111111 |
| 379 | 101111011 | 11111111 |
| 378 | 101111010 | 11111111 |
| 377 | 101111001 | 11111111 |
| 376 | 101111000 | 11111111 |
| 375 | 101110111 | 11111111 |
| 374 | 101110110 | 11111111 |
| 373 | 101110101 | 11111111 |
| 372 | 101110100 | 11111111 |
| 371 | 101110011 | 11111111 |

TABLE OF N, BINARY VALUES OF N AND FIRSTQUADRANT OF QUANTITY—Continued

510*(1/COS(PI/6)*SIN(N*PI/1024*N*PI)+1/6*SIN(3/1024*N*PI))

| N | INPUT<br>BINARY N | OUTPUT<br>BINARY QUANTITY |
|---|---|---|
| 370 | 101110010 | 11111111 |
| 369 | 101110001 | 11111111 |
| 368 | 101110000 | 11111111 |
| 367 | 101101111 | 11111111 |
| 366 | 101101110 | 11111111 |
| 365 | 101101101 | 11111111 |
| 364 | 101101100 | 11111111 |
| 363 | 101101011 | 11111111 |
| 362 | 101101010 | 11111111 |
| 361 | 101101001 | 11111111 |
| 360 | 101101000 | 11111111 |
| 359 | 101100111 | 11111111 |
| 358 | 101100110 | 11111111 |
| 357 | 101100101 | 11111111 |
| 356 | 101100100 | 11111111 |
| 355 | 101100011 | 11111111 |
| 354 | 101100010 | 11111111 |
| 353 | 101100001 | 11111111 |
| 352 | 101100000 | 11111111 |
| 351 | 101011111 | 11111111 |
| 350 | 101011110 | 11111111 |
| 349 | 101011101 | 11111111 |
| 348 | 101011100 | 11111111 |
| 347 | 101011011 | 11111111 |
| 346 | 101011010 | 11111111 |
| 345 | 101011001 | 11111111 |
| 344 | 101011000 | 11111111 |
| 343 | 101010111 | 11111111 |
| 342 | 101010110 | 11111111 |
| 341 | 101010101 | 11111110 |
| 340 | 101010100 | 11111110 |
| 339 | 101010011 | 11111110 |
| 338 | 101010010 | 11111110 |
| 337 | 101010001 | 11111110 |
| 336 | 101010000 | 11111110 |
| 335 | 101001111 | 11111110 |
| 334 | 101001110 | 11111110 |
| 333 | 101001101 | 11111110 |
| 332 | 101001100 | 11111110 |
| 331 | 101001011 | 11111110 |
| 330 | 101001010 | 11111110 |
| 329 | 101001001 | 11111110 |
| 328 | 101001000 | 11111101 |
| 327 | 101000111 | 11111101 |
| 326 | 101000110 | 11111101 |
| 325 | 101000101 | 11111101 |
| 324 | 101000100 | 11111101 |
| 323 | 101000011 | 11111101 |
| 322 | 101000010 | 11111101 |
| 321 | 101000001 | 11111101 |
| 320 | 101000000 | 11111101 |
| 319 | 100111111 | 11111100 |
| 318 | 100111110 | 11111100 |
| 317 | 100111101 | 11111100 |
| 316 | 100111100 | 11111100 |
| 315 | 100111011 | 11111100 |
| 314 | 100111010 | 11111100 |
| 313 | 100111001 | 11111100 |
| 312 | 100111000 | 11111100 |
| 311 | 100110111 | 11111011 |
| 310 | 100110110 | 11111011 |
| 309 | 100110101 | 11111011 |
| 308 | 100110100 | 11111011 |
| 307 | 100110011 | 11111011 |
| 306 | 100110010 | 11111011 |
| 305 | 100110001 | 11111010 |
| 304 | 100110000 | 11111010 |
| 303 | 100101111 | 11111010 |
| 302 | 100101110 | 11111010 |

TABLE OF N, BINARY VALUES OF N AND FIRSTQUADRANT OF QUANTITY – Continued

510*(1/COS(PI/6)*SIN(N*PI/1024*N*PI)+1/6*SIN(3/1024*N*PI))

| N | INPUT BINARY N | OUTPUT BINARY QUANTITY |
|---|---|---|
| 301 | 100101101 | 11111010 |
| 300 | 100101100 | 11111010 |
| 299 | 100101011 | 11111001 |
| 298 | 100101010 | 11111001 |
| 297 | 100101001 | 11111001 |
| 296 | 100101000 | 11111001 |
| 295 | 100100111 | 11111001 |
| 294 | 100100110 | 11111000 |
| 293 | 100100101 | 11111000 |
| 292 | 100100100 | 11111000 |
| 291 | 100100011 | 11111000 |
| 290 | 100100010 | 11111000 |
| 289 | 100100001 | 11110111 |
| 288 | 100100000 | 11110111 |
| 287 | 100011111 | 11110111 |
| 286 | 100011110 | 11110111 |
| 285 | 100011101 | 11110110 |
| 284 | 100011100 | 11110110 |
| 283 | 100011011 | 11110110 |
| 282 | 100011010 | 11110110 |
| 281 | 100011001 | 11110101 |
| 280 | 100011000 | 11110101 |
| 279 | 100010111 | 11110101 |
| 278 | 100010110 | 11110101 |
| 277 | 100010101 | 11110100 |
| 276 | 100010100 | 11110100 |
| 275 | 100010011 | 11110100 |
| 274 | 100010010 | 11110100 |
| 273 | 100010001 | 11110011 |
| 272 | 100010000 | 11110011 |
| 271 | 100001111 | 11110011 |
| 270 | 100001110 | 11110010 |
| 269 | 100001101 | 11110010 |
| 268 | 100001100 | 11110010 |
| 267 | 100001011 | 11110001 |
| 266 | 100001010 | 11110001 |
| 265 | 100001001 | 11110001 |
| 264 | 100001000 | 11110001 |
| 263 | 100000111 | 11110000 |
| 262 | 100000110 | 11110000 |
| 261 | 100000101 | 11110000 |
| 260 | 100000100 | 11101111 |
| 259 | 100000011 | 11101111 |
| 258 | 100000010 | 11101110 |
| 257 | 100000001 | 11101110 |
| 256 | 100000000 | 11101110 |
| 255 | 11111111 | 11101101 |
| 254 | 11111110 | 11101101 |
| 253 | 11111101 | 11101101 |
| 252 | 11111100 | 11101100 |
| 251 | 11111011 | 11101100 |
| 250 | 11111010 | 11101100 |
| 249 | 11111001 | 11101011 |
| 248 | 11111000 | 11101011 |
| 247 | 11110111 | 11101010 |
| 246 | 11110110 | 11101010 |
| 245 | 11110101 | 11101001 |
| 244 | 11110100 | 11101001 |
| 243 | 11110011 | 11101001 |
| 242 | 11110010 | 11101000 |
| 241 | 11110001 | 11101000 |
| 240 | 11110000 | 11100111 |
| 239 | 11101111 | 11100111 |
| 238 | 11101110 | 11100110 |
| 237 | 11101101 | 11100110 |
| 236 | 11101100 | 11100110 |
| 235 | 11101011 | 11100101 |
| 234 | 11101010 | 11100101 |

TABLE OF N, BINARY VALUES OF N AND FIRSTQUADRANT OF QUANTITY—Continued

510*(1/COS(PI/6)*SIN(N*PI/1024*N*PI)+1/6*SIN(3/1024*N*PI))

| N | INPUT BINARY N | OUTPUT BINARY QUANTITY |
|---|---|---|
| 233 | 11101001 | 11100100 |
| 232 | 11101000 | 11100100 |
| 231 | 11100111 | 11100011 |
| 230 | 11100110 | 11100011 |
| 229 | 11100101 | 11100010 |
| 228 | 11100100 | 11100010 |
| 227 | 11100011 | 11100001 |
| 226 | 11100010 | 11100001 |
| 225 | 11100001 | 11100000 |
| 224 | 11100000 | 11100000 |
| 223 | 11011111 | 11011111 |
| 222 | 11011110 | 11011111 |
| 221 | 11011101 | 11011110 |
| 220 | 11011100 | 11011110 |
| 219 | 11011011 | 11011101 |
| 218 | 11011110 | 11011101 |
| 217 | 11011101 | 11011100 |
| 216 | 11011000 | 11011100 |
| 215 | 11010111 | 11011011 |
| 214 | 11010110 | 11011010 |
| 213 | 11010101 | 11011010 |
| 212 | 11010100 | 11011001 |
| 211 | 11010011 | 11011001 |
| 210 | 11010010 | 11011000 |
| 209 | 11010001 | 11011000 |
| 208 | 11010000 | 11010111 |
| 207 | 11001111 | 11010110 |
| 206 | 11001110 | 11010110 |
| 205 | 11001101 | 11010101 |
| 204 | 11001100 | 11010101 |
| 203 | 11001011 | 11010100 |
| 202 | 11001010 | 11010011 |
| 201 | 11001001 | 11010011 |
| 200 | 11001000 | 11010010 |
| 199 | 11000111 | 11010001 |
| 198 | 11000110 | 11010001 |
| 197 | 11000101 | 11010000 |
| 196 | 11000100 | 11001111 |
| 195 | 11000011 | 11001111 |
| 194 | 11000010 | 11001110 |
| 193 | 11000001 | 11001101 |
| 192 | 11000000 | 11001101 |
| 191 | 10111111 | 11001100 |
| 190 | 10111110 | 11001011 |
| 189 | 10111101 | 11001011 |
| 188 | 10111100 | 11001010 |
| 187 | 10111011 | 11001001 |
| 186 | 10111010 | 11001001 |
| 185 | 10111001 | 11001000 |
| 184 | 10111000 | 11000111 |
| 183 | 10110111 | 11000110 |
| 182 | 10110110 | 11000110 |
| 181 | 10110101 | 11000101 |
| 180 | 10110100 | 11000100 |
| 179 | 10110011 | 11000100 |
| 178 | 10110010 | 11000011 |
| 177 | 10110001 | 11000010 |
| 176 | 10110000 | 11000001 |
| 175 | 10101111 | 11000001 |
| 174 | 10101110 | 11000000 |
| 173 | 10101101 | 10111111 |
| 172 | 10101100 | 10111110 |
| 171 | 10101011 | 10111101 |
| 170 | 10101010 | 10111101 |
| 169 | 10101001 | 10111100 |
| 168 | 10101000 | 10111011 |
| 167 | 10100111 | 10111010 |
| 166 | 10100110 | 10111010 |
| 165 | 10100101 | 10111001 |

TABLE OF N, BINARY VALUES OF N AND FIRSTQUADRANT OF QUANTITY—Continued

510*(1/COS(PI/6)*SIN(N*PI/1024*N*PI)+1/6*SIN(3/1024*N*PI))

| N | INPUT BINARY N | OUTPUT BINARY QUANTITY |
|---|---|---|
| 164 | 10100100 | 10111000 |
| 163 | 10100011 | 10110111 |
| 162 | 10100010 | 10110110 |
| 161 | 10100001 | 10110101 |
| 160 | 10100000 | 10110101 |
| 159 | 10011111 | 10110100 |
| 158 | 10011110 | 10110011 |
| 157 | 10011101 | 10110010 |
| 156 | 10011100 | 10110001 |
| 155 | 10011011 | 10110000 |
| 154 | 10011010 | 10101111 |
| 153 | 10011001 | 10101111 |
| 152 | 10011000 | 10101110 |
| 151 | 10010111 | 10101101 |
| 150 | 10010110 | 10101100 |
| 149 | 10010101 | 10101011 |
| 148 | 10010100 | 10101010 |
| 147 | 10010011 | 10101001 |
| 146 | 10010010 | 10101000 |
| 145 | 10010001 | 10101000 |
| 144 | 10010000 | 10100111 |
| 143 | 10001111 | 10100110 |
| 142 | 10001110 | 10100101 |
| 141 | 10001101 | 10100100 |
| 140 | 10001100 | 10100011 |
| 139 | 10001011 | 10100010 |
| 138 | 10001010 | 10100001 |
| 137 | 10001001 | 10100000 |
| 136 | 10001000 | 10011111 |
| 135 | 10000111 | 10011110 |
| 134 | 10000110 | 10011101 |
| 133 | 10000101 | 10011100 |
| 132 | 10000100 | 10011011 |
| 131 | 10000011 | 10011010 |
| 130 | 10000010 | 10011001 |
| 129 | 10000001 | 10011000 |
| 128 | 10000000 | 10010111 |
| 127 | 1111111 | 10010110 |
| 126 | 1111110 | 10010101 |
| 125 | 1111101 | 10010100 |
| 124 | 1111100 | 10010011 |
| 123 | 1111011 | 10010010 |
| 122 | 1111010 | 10010001 |
| 121 | 1111001 | 10010000 |
| 120 | 1111000 | 10001111 |
| 119 | 1110111 | 10001110 |
| 118 | 1110110 | 10001101 |
| 117 | 1110101 | 10001100 |
| 116 | 1110100 | 10001011 |
| 115 | 1110011 | 10001010 |
| 114 | 1110010 | 10001001 |
| 113 | 1110001 | 10001000 |
| 112 | 1110000 | 10000111 |
| 111 | 1101111 | 10000110 |
| 110 | 1101110 | 10000101 |
| 109 | 1101101 | 10000100 |
| 108 | 1101100 | 10000011 |
| 107 | 1101011 | 10000010 |
| 106 | 1101010 | 10000001 |
| 105 | 1101001 | 10000000 |
| 104 | 1101000 | 1111111 |
| 103 | 1100111 | 1111110 |
| 102 | 1100110 | 1111100 |
| 101 | 1100101 | 1111011 |
| 100 | 1100100 | 1111010 |
| 99 | 1100011 | 1111001 |
| 98 | 1100010 | 1111000 |
| 97 | 1100001 | 1110111 |
| 96 | 1100000 | 1110110 |

TABLE OF N, BINARY VALUES OF N AND FIRSTQUADRANT OF QUANTITY—Continued

510*(1/COS(PI/6)*SIN(N*PI/1024*N*PI)+1/6*SIN(3/1024*N*PI))

| N | INPUT<br>BINARY N | OUTPUT<br>BINARY QUANTITY |
|---|---|---|
| 95 | 1011111 | 1110101 |
| 94 | 1011110 | 1110100 |
| 93 | 1011101 | 1110010 |
| 92 | 1011100 | 1110001 |
| 91 | 1011011 | 1110000 |
| 90 | 1011010 | 1101111 |
| 89 | 1011001 | 1101110 |
| 88 | 1011000 | 1101101 |
| 87 | 1010111 | 1101100 |
| 86 | 1010110 | 1101011 |
| 85 | 1010101 | 1101001 |
| 84 | 1010100 | 1101000 |
| 83 | 1010011 | 1100111 |
| 82 | 1010010 | 1100110 |
| 81 | 1010001 | 1100101 |
| 80 | 1010000 | 1100100 |
| 79 | 1001111 | 1100010 |
| 78 | 1001110 | 1100001 |
| 77 | 1001101 | 1100000 |
| 76 | 1001100 | 1011111 |
| 75 | 1001011 | 1011110 |
| 74 | 1001010 | 1011101 |
| 73 | 1001001 | 1011011 |
| 72 | 1001000 | 1011010 |
| 71 | 1000111 | 1011001 |
| 70 | 1000110 | 1011000 |
| 69 | 1000101 | 1010111 |
| 68 | 1000100 | 1010101 |
| 67 | 1000011 | 1010100 |
| 66 | 1000010 | 1010011 |
| 65 | 1000001 | 1010010 |
| 64 | 1000000 | 1010001 |
| 63 | 111111 | 1001111 |
| 62 | 111110 | 1001110 |
| 61 | 111101 | 1001101 |
| 60 | 111100 | 1001100 |
| 59 | 111011 | 1001010 |
| 58 | 111010 | 1001001 |
| 57 | 111001 | 1001000 |
| 56 | 111000 | 1000111 |
| 55 | 110111 | 1000110 |
| 54 | 110110 | 1000100 |
| 53 | 110101 | 1000011 |
| 52 | 110100 | 1000010 |
| 51 | 110011 | 1000001 |
| 50 | 110010 | 111111 |
| 49 | 110001 | 111110 |
| 48 | 110000 | 111101 |
| 47 | 101111 | 111100 |
| 46 | 101110 | 111010 |
| 45 | 101101 | 111001 |
| 44 | 101100 | 111000 |
| 43 | 101011 | 110111 |
| 42 | 101010 | 110101 |
| 41 | 101001 | 110100 |
| 40 | 101000 | 110011 |
| 39 | 100111 | 110010 |
| 38 | 100110 | 110000 |
| 37 | 100101 | 101111 |
| 36 | 100100 | 101110 |
| 35 | 100011 | 101101 |
| 34 | 100010 | 101011 |
| 33 | 100001 | 101010 |
| 32 | 100000 | 101001 |
| 31 | 11111 | 100111 |
| 30 | 11110 | 100110 |
| 29 | 11101 | 100101 |
| 28 | 11100 | 100100 |

TABLE OF N, BINARY VALUES OF N AND FIRSTQUADRANT OF QUANTITY—Continued

510*(1/COS(PI/6)*SIN(N*PI/1024*N*PI)+1/6*SIN(3/1024*N*PI))

| N | INPUT BINARY N | OUTPUT BINARY QUANTITY |
|---|---|---|
| 27 | 11011 | 100010 |
| 26 | 11010 | 100001 |
| 25 | 11001 | 100000 |
| 24 | 11000 | 11110 |
| 23 | 10111 | 11101 |
| 22 | 10110 | 11100 |
| 21 | 10101 | 11011 |
| 20 | 10100 | 11001 |
| 19 | 10011 | 11000 |
| 18 | 10010 | 10111 |
| 17 | 10001 | 10101 |
| 16 | 10000 | 10100 |
| 15 | 1111 | 10011 |
| 14 | 1110 | 10010 |
| 13 | 1101 | 10000 |
| 12 | 1100 | 1111 |
| 11 | 1011 | 1110 |
| 10 | 1010 | 1100 |
| 9 | 1001 | 1011 |
| 8 | 1000 | 1010 |
| 7 | 111 | 1001 |
| 6 | 110 | 111 |
| 5 | 101 | 110 |
| 4 | 100 | 101 |
| 3 | 11 | 11 |
| 2 | 10 | 10 |
| 1 | 1 | 1 |
| 0 | 0 | 0 |

The eight exclusive OR gates are R.C.A. CD4030 or equivalent. The sine D/A is a Hybird System 372 or equivalent. The power amplifier 56, 56′, 56″ may be any audio power amplifier.

The circuit of FIG. 3 operates in the following manner. The output signals of the square wave generator 42 are fed into the inputs of the three parallel counters 44, 44′, 44″ which in turn supply an input to each of their respective read only memories 50, 50′, 50″. The output frequency $\phi$ from the square wave generator 42 is divided down by up/down counters 44, 44′, 44″. The counters produce an output frequency equal to $\phi$/2048.

The output from each counter 44, 44′, 44″ provides an input to their respective read only memories 50, 50′, 50″. Eleven parallel output bits are utilized from each binary counter. The nine least significant bits from each counter are parallel fed into their respective ROM 50, 50′, 50″. The tenth bit is supplied on one input to their respective EX-OR, hereinafter discussed, and the eleventh bit supplies the sign bit input to their respective D/A, also hereinbefore discussed. When the output frequency of power amplifier 56 phase A is beginning its first quarter cycle, the following sequence of events occur. The output from generator 42 that provides an input to counter 44 is at zero. The output N of binary counter 44 is all zeros. The input N of ROM 50 as well as its output binary N are all zeros. The output of EX-OR 52 and the output of D/A 54 are likewise zero. When the generator 42 provides an input to counter 44, the frequency $\phi$ is divided down by a factor of 2048, each quarter cycle having 512 equally spaced segments. From count 1 through count 511, the parallel output of the ROM 50 follows the binary N quantity shown by the truth table according to its N input. For the first quarter cycle, the tenth and eleventh bit of the binary counter 44 remains at zero. With the tenth bit at zero, the output of the EX-OR follows its input. The eleventh bit of binary counter 44 is also zero, therefore, the sign input to the D/A is zero providing a positive output signal from the D/A. Thus as the number N progresses from 0 through 511, the first quarter of the output line to line signal at frequency $\phi$ is produced, see FIg. 2A between 60 and 62.

When the ROM 52 is all ones in nine parallel bits of input it provides an input to the EX-OR 52, the ROM is at number 511. On the next count, the eight bits of the ROM output become all zeros and the tenth bit changes from zero to 1. The one from the tenth bit inverses the output from the EX-OR 52 so that a zero input to the EX-OR is now the binary quantity of number 511 causing the second quarter of the sine wave line to line output of amplifier 56 to decrease progressively downward from maximum value to zero at the point 63 of FIG. 2A when the ROM again increases in count from 1 to 511.

When the next count occurs after the number 511, the ROM 50 again has all zeros in its nine parallel output bits, a zero again in the tenth bit position, and the eleventh bit changes from zero to one. The one on the sign bit input to D/A 56 reverses the polarity of its output. The output of the D/A 56 is now negative. The zero bit in the ninth bit position of the binary counter causes the EX-OR to return to its first quarter cycle straight through configuration, that is as the output of the ROM increases the N from 1 to 511, the output of the EX-OR follows accordingly. The D/A now produces a negative output progressively increasing to the lowest level or the peak of the third quarter. The 10th bit of the ROM 50 changes from a zero to a one again as discussed for the second quarter of the cycle and follows the same operational manner as hereinbefore discussed to provide the fourth quarter of the analog wave output.

The device continues to provide the desired distorted output signal as long as the generator produces an output.

It should be understood that the similar circuits having numerals and "numerals of the same FIG. 3 operate in the same manner as the operational procedure discussed but at a 120° phase shifted relationship from one another, when counter 44 is at binary O counter 44' is at binary 682 and counter 44" is at binary 1364.

Figure 6:
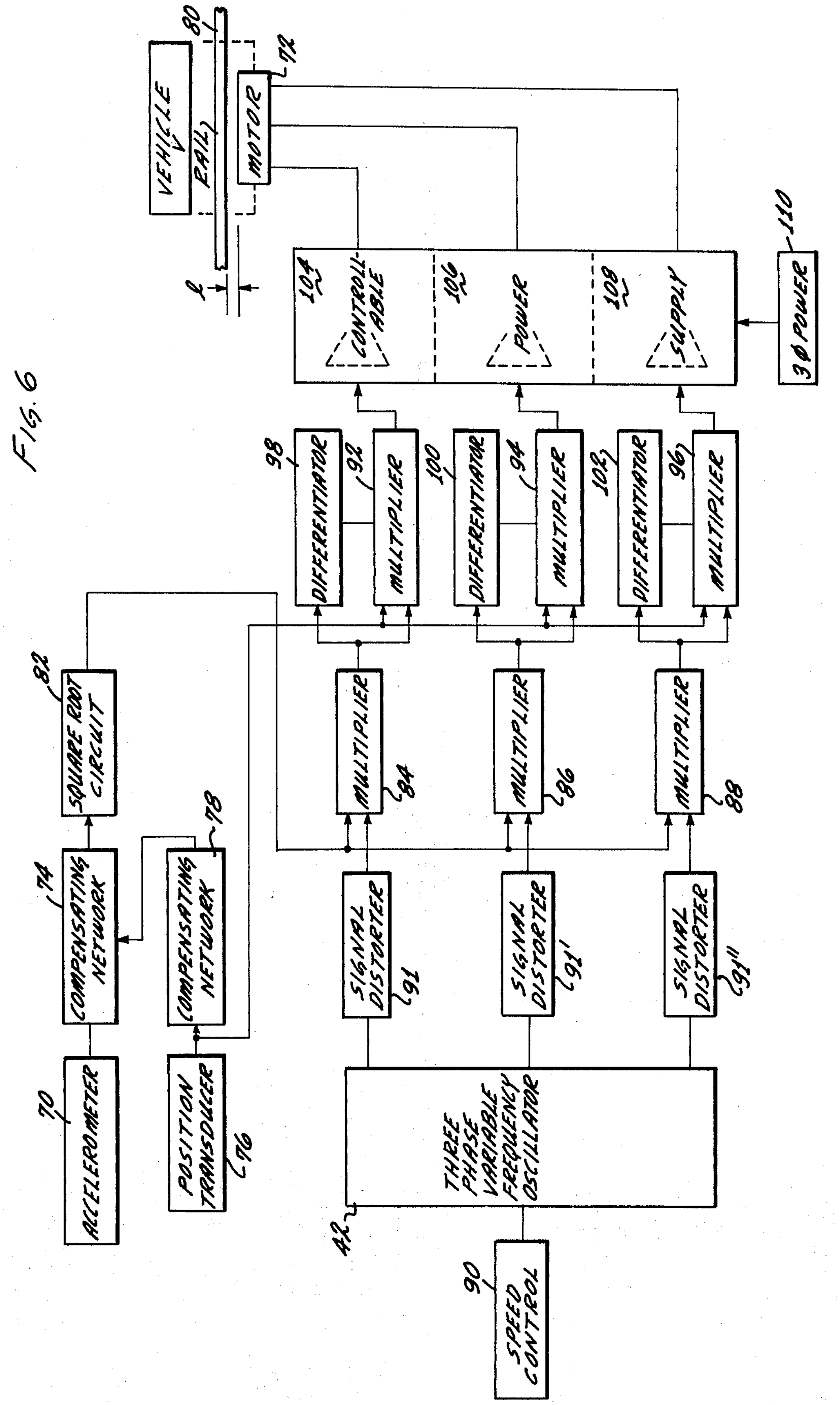
FIG. 6 is a showing of the preferred application of the instant invention.

An application of the instant invention is shown by the block diagram of FIG. 6, wherein the invention is adapted to a feedback and power control circuit of a magnetically suspended and propelled vehicle. The invention is especially advantageous for this application as a higher voltage level to produce the force fields is obtained without an increase in the weight of the amplifiers carried by the suspended vehicle. It should be noted, however, that the use of the instant invention is not limited to the embodiment shown by FIG. 6 and could be successfully applied to any circuit where additional voltage level is required from a line-to-line three phase system. A complete and detailed discussion of the specific components of the circuit of FIG. 6 can be found in U.S. Pat. No. 3,726,880. A brief summary thereof is presented below.

One sensor 70 is an inertial accelerometer, giving an output signal voltage for an acceleration in the vertical direction as the motor 72 moves vertically up or down with regard to a fixed point in free space. The output thereof moves through compensating network 74 to alter the frequency versus amplitude response.

Another sensor 76 is a position transducer. This gives length of vertical gap information. It may employ mechanical contact, or optical, sonic means, electrical or pneumatic, to accomplish measurement. The vertical gap length *l*, usually within the range of from substantially zero to 1 inch, could, however, be greater depending on various requirements. A second compensating network 78 provides an adjustable voltage reference for the gap measurement and provides amplification and differentiation to provide a velocity signal output. Thereafter, the position signal is summed with the acceleration signal and amplified.

The attractive force between motor 72 and rail 80 is proportional to the square of the current passing through the coils of the motor. To provide feedback loop stability, the second order function must be linearized by square root circuit 82 having an electrical output equivalent to the square root of its electrical input.

Multipliers 84, 86 and 88 provide an output signal voltage equal to the product of its input voltages. The output of the square root circuit 82 is separately multiplied with the output of the three phase oscillator 42 as controlled in amplitude by speed control 90 and distorted, as hereinbefore explained; by distortion means 91 comprising of FIG. 3 inclusive.

Likewise, multipliers 92, 94 and 96 multiply the outputs of their associated multipliers 84, 86 and 88 respectively with the signal voltage from position transducer 76. The output voltage from each of the multipliers 92, 94 and 96 is summed with a parallel differential signal from their associated differentiator 98, 100 and 102 respectively. This summed output voltage supplies a control signal to the input of controllable amplifiers 104, 106 and 108 so as to provide a varying flux level and frequency at motor 72.

Speed and direction controls 90 provide direction control and frequency control of oscillator 42. System power is supplied from an external source 110, which could be any convenient power source such as a power house or vehicle borne dynamo.

Referring again to the inputs of controllable power amplifiers 104, 106 and 108, each input is represented by a different one of the waveforms shown in FIG. 4, for example A phase is the input to amplifier 104, B phase the input to amplifier 106 and C phase the input to amplifier 108. These inputs, of course, could be reversed or connected in any other order that could result in three equally phase related voltage inputs to the three amplifiers.

Referring now to FIG. 5, the line-to-line voltage waveforms 64, 66 and 68 are shown as sinusoidal in wave shape with a greater amplitude than the distorted waveform of FIG. 4 taken with respect to ground potential. The end result is greater line-to-line output voltage than the output of a three phase power amplifier having a conventional sinusoidal input to each of its phases.

The invention may be embodied in other specific forms without departing from the spirit or essential characteristics thereof. The present embodiments are therefore to be considered in all aspects as illustrative and not restrictive, the scope of the invention being indicated by the appended claims rather than by the foregoing description, and all changes which come within the meaning and range of equivalency of the claims are therefore intended to be embraced therein.

What is claimed and desired to be secured by United States letters Patents is:

1. Apparatus for increasing the maximum available phase-to-phase output voltage level of a multi-phase amplifier operating at a maximum phase-to-ground voltage level, comprising:

square wave generator; for producing a plurality of separate phase related voltage signals of a selected frequency; and electrical circuit means connected in series between said square wave generator and said amplifier for reforming each of said plurality of separate phase related signals from said square wave generator to a voltage signal having the waveform $2/\sqrt{3}$ sine $\phi$ + 1/6 (sine $3\phi$).

2. A method of increasing the maximum available phase-to-phase sinusoidal output signal voltage level of a multi-phase amplifier operating at a maximum phase-to-ground output signal voltage level comprising the steps of;

producing a first plurality of phase related square wave signal voltages of a selected frequency;

dividing down each phase of said square wave signal voltages by a fixed amount;

counting the divided down frequencies and producing a digital output signal equivalent thereto;

distorting said digital output signal from said divided down frequencies to a digital signal having an equivalent analog waveform equal to a quadrant of $2/\sqrt{3}$ sine $\phi$ + 1/6 (sine $3\phi$);

periodically inverting said digital signal;

converting said digital signal to an analog equivalent signal;

periodically reversing the polarity of said analog signal;

and amplifying said analog signal.

3. Apparatus for increasing the maximum available sinusoidal phase-to-phase output voltage level of a multi-phase amplifier operating at a maximum phase-to-ground voltage level comprising in combination:

a square wave generator for producing a first plurality of phase related square wave signal voltages of a selected frequency;

a plurality of up/down counters one connected to each of said square wave generator outputs for dividing down the frequency of said square wave generator;

a plurality of read only memories one connected to each of said plurality of up/down counters for distorting said divided down frequency to produce a digital signal having an analog equivalent of the first quadrant of the waveform $2/\sqrt{3}$ sine $\phi + 1/6$ (sine $3\phi$);

a plurality of exclusive OR gates one connected to each of said plurality of read only memories for periodically producing the inverse of said digital signal; and a plurality of digital to analog converters each one of said converters having its input connected to the output of one of said plurality of exclusive OR gates and the most significant bit of its associated up/down counters for converting said digital signal to an analog signal having the waveform $2/\sqrt{3}$ sine $\phi + 1/6$ (sine $3\phi$) and periodically inverting said analog signal.

4. The apparatus as defined in claim 3 wherein said exclusive OR gates produce said inverse digital signal during the second and fourth quadrants of said digital signal.

5. The apparatus as defined in claim 3 wherein said digital to analog converters invert said analog signal during the third and fourth quadrants.

* * * * *